(12) United States Patent
Horiuch et al.

(10) Patent No.: US 6,492,250 B1
(45) Date of Patent: Dec. 10, 2002

(54) POLYCIDE GATE STRUCTURE AND METHOD OF MANUFACTURE

(75) Inventors: Hidetake Horiuch, Hsinchu (TW); Chan-Lon Yang, Taipei (TW)

(73) Assignee: United Microelectronics Corp., Hsinchu (TW)

( * ) Notice: Subject to any disclaimer, the term of this patent is extended or adjusted under 35 U.S.C. 154(b) by 193 days.

(21) Appl. No.: 09/638,923

(22) Filed: Aug. 15, 2000

(51) Int. Cl.[7] .......................................... H01L 21/4763
(52) U.S. Cl. ..................... 438/592; 438/595; 438/596
(58) Field of Search .................. 438/592, 595, 438/596; 257/378, 394

(56) References Cited

U.S. PATENT DOCUMENTS

| | | | |
|---|---|---|---|
| 5,368,686 A | * 11/1994 | Tatsumi et al. | 156/656 |
| 5,698,072 A | * 12/1997 | Fukuda | 156/653.1 |
| 6,001,718 A | * 12/1999 | Katata et al. | 438/592 |
| 6,017,809 A | * 1/2000 | Inumiya et al. | 438/585 |
| 6,162,717 A | * 12/2000 | Yeh | 438/595 |
| 6,177,334 B1 | * 1/2001 | Chen et al. | 438/584 |

OTHER PUBLICATIONS

"Control of sidewall deposition and profile in Ti–polycide tching" M. Nagase, E. Soda, K. Yosbida, and N. Aoto / 1999, Dry Process Symposium / p. 127–132.

* cited by examiner

Primary Examiner—Trung Dang
(74) Attorney, Agent, or Firm—J.C. Patents

(57) ABSTRACT

A polycide gate structure and a method of forming the polycide gate. A substrate having a gate dielectric layer, a polysilicon layer, a silicide layer and an insulation layer thereon is provided. The polysilicon layer is above the gate dielectric layer, the silicide layer is above the polysilicon layer, and the insulation layer is above the silicide layer. A patterned photoresist layer is formed over the insulation layer. Using the photoresist layer as a mask, an anisotropic etching operation is carried out to remove the exposed insulation layer. Again using the photoresist layer as a mask, a first type of plasma is used to carry out a first anisotropic etching operation to remove the exposed silicide layer. A metallic oxide layer is formed on the sidewalls of the silicide layer by the oxidation of a portion of the retained silicide layer. Using the photoresist layer as a mask, a second type of plasma is used to carry out a second anisotropic etching operation to remove the exposed polysilicon layer. The metallic oxide layer is resistant to attack by the second type of plasma.

11 Claims, 2 Drawing Sheets

POLYCIDE GATE STRUCTURE AND METHOD OF MANUFACTURE

BACKGROUND OF THE INVENTION

1. Field of the Invention

The present invention relates to a semiconductor structure and method of manufacture. More particularly, the present invention relates to a polycide gate structure and method of manufacture.

2. Description of Related Art

As dimensions of semiconductor devices continue to shrink, electrical resistance of interconnecting lines will increase. To reduce electrical resistance, a silicide layer is normally deposited over the polysilicon gate in most MOS manufacturing processes to form a polycide gate structure. FIG. 1 is a schematic cross-sectional view showing a conventional polycide gate structure. To form a conventional polycide gate, a gate dielectric layer 110, a conformal polysilicon layer 120, a silicide layer 130, a silicon nitride layer 140 and a patterned photoresist layer 150 are sequentially formed over a substrate 100. Using the patterned photoresist layer 150 as a mask, an anisotropic etching operation is carried out to etch the silicon nitride 140, the silicide layer 130 and the polysilicon layer 120 sequentially to form the polycide gate. The silicon nitride layer 140 serves as a cap layer in a subsequent self-aligned contact process. In the etching step, HBr/Cl$_2$ plasma 170 is often used for etching the polysilicon layer 120. In general, chlorine plasma (Cl$_2$) is rarely used alone because serious undercutting of the polysilicon layer 120 may occur resulting in poor quality. On the other hand, if hydrogen bromide (HBr) plasma is used alone, line width of gates in different areas of a wafer may be affected leading to a variation in the electrical properties of devices. Etching with HBr/Cl$_2$ plasma is able to prevent both undercutting and line width problems.

However, when the polysilicon layer 120 is etched using HBr/Cl$_2$ plasma 170, the sidewalls of the silicide layer 130 above the polysilicon layer 120 may be attacked by highly reactive Cl$_2$ plasma. Ultimately, recesses 135 may form due to the undercutting of the silicide layer 130.

FIG. 2 is a schematic cross-sectional view showing an improved version of a conventional gate polycide structure. The newer version is able to prevent the undercutting of the silicide layer when the polysilicon layer is etched. To form the gate structure as shown in FIG. 2, a gate dielectric layer 210, a conformal polysilicon layer 220, a silicide layer 230, a silicon nitride layer 240 and a patterned photoresist layer 250 are sequentially formed over a substrate 200. The photoresist layer 250 has a width L. Using the photoresist layer 250 as a mask, an anisotropic etching operation is carried out to etch the silicon nitride layer 240 and the silicide layer 230 in sequence. The exposed polysilicon layer 220 is etched using HBr/Cl$_2$ plasma with CF$_4$ or C$_2$F$_6$ molecules therein to form a polycide gate 280. The presence of CF$_4$ or C$_2$F$_6$ molecules in the plasma will result in a carbon chain polymerization. Hence, a protective polymer layer 260 is formed over the sidewalls of the silicide layer 230, the silicon nitride layer 240 and the patterned photoresist layer 250. Hence, corrosion of the silicide layer 230 is prevented. However, thickness of the protective polymer layer 260 in various locations within the wafer is difficult to control. Consequently, fabricating a polysilicon layer 220 of width L just underneath the silicide layer 230 is difficult to do with precision, leading to a deterioration of device properties. In addition, the additives CF$_4$ and C$_2$F$_6$ are not quite suitable for etching polysilicon layer 220 when a silicon nitride layer is used as a hard mask. This is because CF$_4$ and C$_2$F$_6$ plasma has a high etching rate for silicon nitride. Consequently, too much silicon nitride may be removed from the silicon nitride layer 240. Ultimately, subsequent process for forming a self-aligned contact may be affected.

SUMMARY OF THE INVENTION

Accordingly, one object of the present invention is to provide a method of forming a polycide gate. A substrate having a gate dielectric layer, a polysilicon layer, a silicide layer and an insulation layer thereon is provided. The polysilicon layer is formed above the gate dielectric layer, the silicide layer is formed above the polysilicon layer, and the insulation layer is formed above the silicide layer. A patterned photoresist layer is formed over the insulation layer. Using the photoresist layer as a mask, an anisotropic etching operation is carried out to remove the exposed insulation layer. Again using the photoresist layer as a mask, a first type of plasma is used to carry out a first anisotropic etching operation to remove the exposed silicide layer. A metallic oxide layer is formed on the sidewalls of the silicide layer by the oxidation of a portion of the retained silicide layer. Using the photoresist layer as a mask, a second type of plasma is used to carry out a second anisotropic etching operation to remove the exposed polysilicon layer. The metallic oxide layer is resistant to attack by the second type of plasma.

In addition, the method of forming a polycide gate in this invention further includes removing the photoresist layer after the first anisotropic etching step. Hence, the patterned insulation layer becomes the hard mask layer in the second anisotropic etching step.

This invention utilizes the formation of a metallic oxide layer on the sidewalls of the silicide layer after the first anisotropic etching step. Hence, the silicide layer is protected from reactive components inside the second type of plasma by the metallic oxide layer when the polysilicon layer is etched in the second anisotropic etching step. In other words, undercutting of the silicide layer is prevented. Furthermore, since no additives such as CF$_4$ and C$_2$F$_6$ molecules are added to the reactive plasma in the polysilicon etching operation, thickness variation in protective polymer layer across the wafer no longer presents a problem. Moreover, even if an insulation layer fabricated from silicon nitride material is used as an etching hard mask, loss of insulation material no longer presents a problem for forming self-aligned contacts in a subsequent operation.

This invention also provides a polycide gate structure. The polycide gate structure is formed by the aforementioned method. The structure is formed on a substrate having a gate dielectric layer thereon. The polycide gate structure includes a patterned polysilicon layer, a silicide layer, a metallic oxide layer and an insulation layer. The polysilicon layer is above the gate dielectric layer. The silicide layer is above the polysilicon layer. The metallic oxide layer is on the sidewalls of the silicide layer. The metallic element within the metallic layer is identical to the metallic element within the silicide layer. The insulation layer is above the silicide layer.

It is to be understood that both the foregoing general description and the following detailed description are exemplary, and are intended to provide further explanation of the invention as claimed.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention. In the drawings.

DESCRIPTION OF THE PREFERRED EMBODIMENTS

Figure 1:
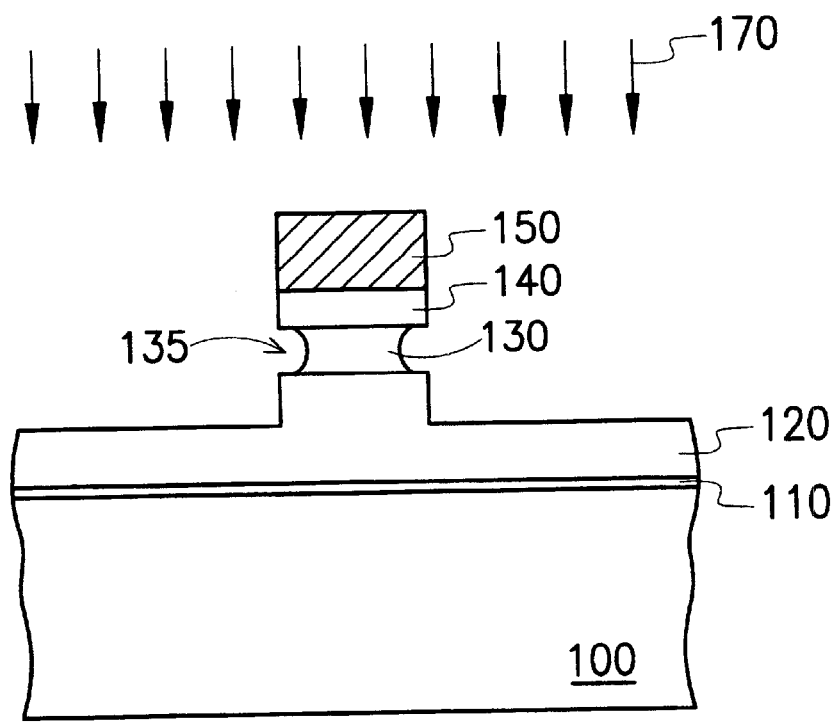
FIG. 1 is a schematic cross-sectional view showing a conventional polycide gate structure.
Figure 2:
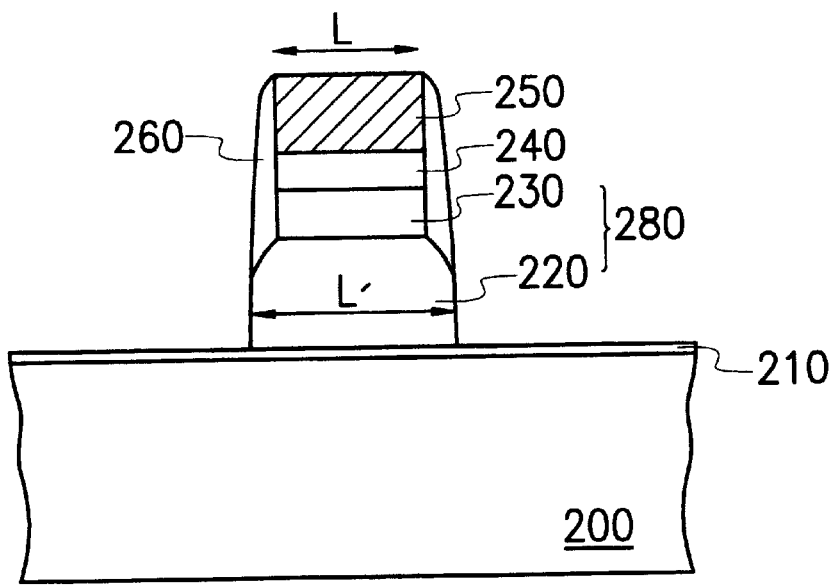
FIG. 2 is a schematic cross-sectional view showing an improved version of a conventional gate polycide structure.

Reference will now be made in detail to the present preferred embodiments of the invention, examples of which are illustrated in the accompanying drawings. Wherever possible, the same reference numbers are used in the drawings and the description to refer to the same or like parts.

Figure 3A:
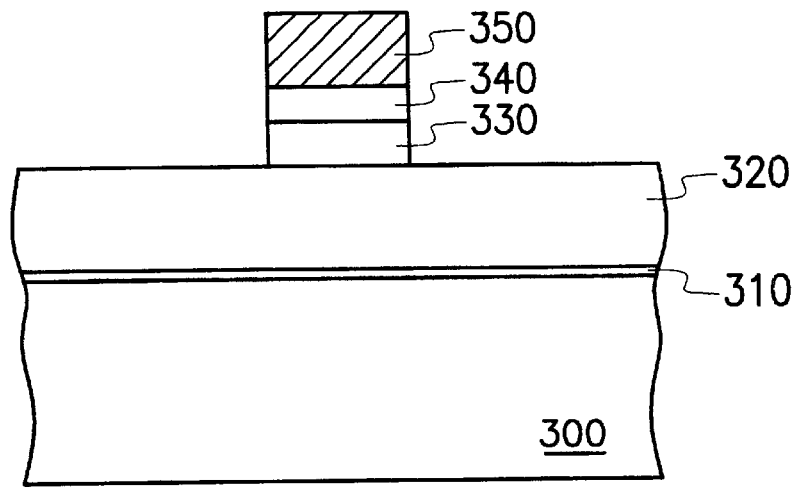
FIGS. 3A through 3C are schematic cross-sectional views showing the progression of steps for forming a polycide gate according to one preferred embodiment of this invention.
Figure 3B:
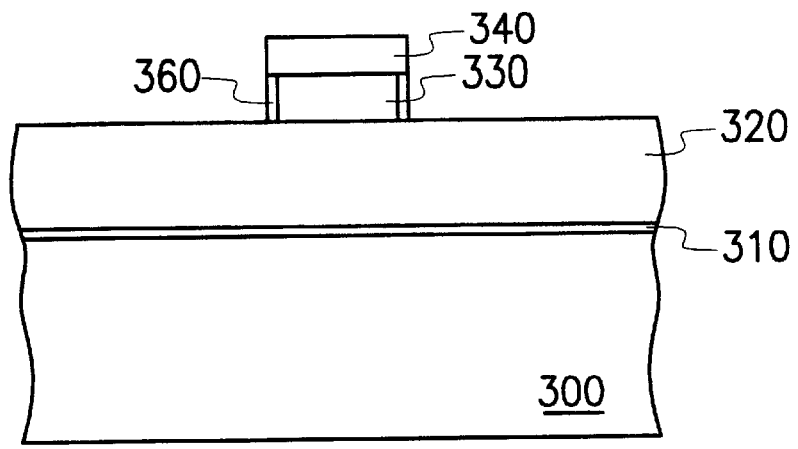
Figure 3C:
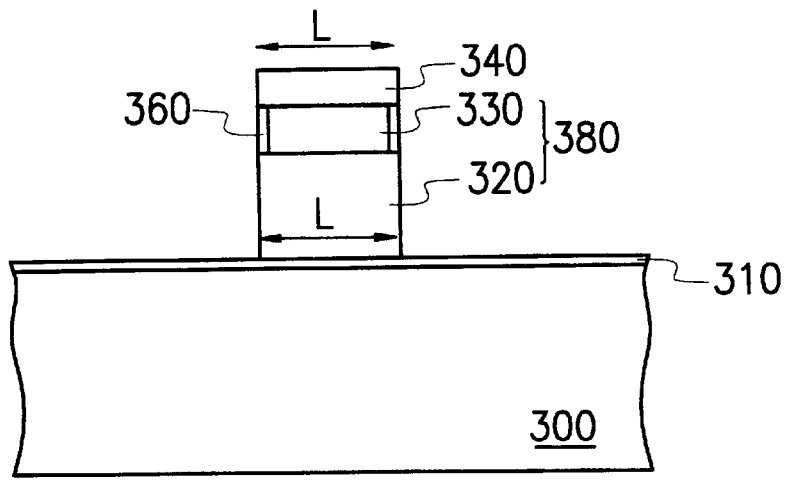

FIGS. 3A through 3C are schematic cross-sectional views showing the progression of steps for forming a polycide gate according to one preferred embodiment of this invention.

As shown in FIG. 3A, a substrate 300 is provided. A gate dielectric layer 310, a polysilicon layer 320, a silicide layer 330 and an insulation layer 340 are sequentially formed over the substrate 300. A patterned photoresist layer 350 having a line width L is formed over the insulation layer 340. The silicide layer 330 can be a tungsten silicide (WSi) layer, a titanium silicide (TiSi) layer, a tantalum silicide (TaSi) layer, a zirconium silicide (ZrSi) layer or a hafnium silicide (HfSi) layer, for example. Tungsten, titanium, tantalum, zirconium and hafnium atoms are chosen to form the silicide layer 330 because they form a stronger bond with oxygen atoms than chlorine atoms. The insulation layer 340 can be a silicon nitride (SiN) layer, a silicon oxynitride (SiON) layer or a silicon oxide layer, for example. The insulation layer 340 serves as a cap layer in a subsequent process for forming a self-aligned contact. An anisotropic etching operation is carried out to remove the exposed insulation layer 340 using the photoresist layer 350 as a mask. Thereafter, a first anisotropic etching operation is carried out to remove the exposed silicide layer 330 using a first type of plasma. The first type of plasma can be $Cl_2/C_2F_6/N_2$ plasma or $Cl_2/CF_4$ plasma, for example. The advantages of using the $Cl_2/C_2F_6/N_2$ plasma or the $Cl_2/CF_4$ plasma is that small amounts of carbon chain polymers and other high steam pressure products are formed on the sidewalls of the silicide layer 330. Hence, the undercutting of the silicide layer 330 can be prevented. In an article entitled 'Control of sidewall deposition and profile in Ti-polycide etching' by M. Nagase et al., Dry Proc. 21th Symp. on Dry Process, 1999, pg. 127, it is shown that when $Cl_2/CF_4$ plasma is used to etch a silicide layer, the thickness of carbon chain polymers and other high steam pressure products formed on the sidewalls of the silicide layer does not vary with regard to location on the wafer. Therefore, using $Cl_2/CF_4$ plasma will not increase gate width errors.

As shown in FIG. 3B, the photoresist layer 350 is removed. The photoresist layer 350 is removed, for example, by oxygen plasma ashing and by subsequently applying an alkaline cleaning solvent. A metallic oxide layer 360 is formed on the sidewalls of the retained silicide layer 330 by oxidation. The sidewalls of the silicide layer 330 are oxidized, for example, by the application of oxygen ($O_2$) plasma or a $H_2SO_4/H_2O_2/H_2O$ mixture on the substrate 300. The ratio of sulfuric acid, hydrogen peroxide and water in the $H_2SO_4/H_2O_2/H_2O$ mixture is 1:1:5, for example.

As shown in FIG. 3C, using the insulation layer 340 as an etching mask, a second type of plasma is used in a second anisotropic etching operation to remove the exposed polysilicon layer 320. The retained polysilicon layer 320 and the silicide layer 330 together constitute the gate polycide structure 380. In the second anisotropic etching step, HBr/$Cl_2$ plasma may be used. However, the metallic element within the metallic oxide layer 360 must have a higher bonding strength with oxygen than chlorine to prevent the attack of the metallic layer 360 by chlorine in the HBr/$Cl_2$ plasma, leading to subsequent damage of the interior silicide layer 330. Since metallic elements such as tungsten, titanium, tantalum, zirconium and hafnium all form stronger bonds with oxygen than chlorine, the suicide layer 330 can be a tungsten silicide layer, a titanium silicide layer, a tantalum silicide layer, a zirconium silicide layer or a hafnium silicide layer, for example.

After the aforementioned steps, a gate polycide structure that includes a patterned polysilicon layer 320, a silicide layer 330, a metallic oxide layer 360 and an insulation layer 340 is formed. The polysilicon layer 320 is above the gate dielectric layer 310 and the silicide layer 330 is above the polysilicon layer 320. The metallic oxide layer 360 is on the sidewalls of the silicide layer 330. The metallic element within the metallic oxide layer 360 is identical with the metallic element within the silicide layer 330. The insulation layer 340 is above the silicide layer 330.

In addition, the silicide layer 330 can be a tungsten silicide layer, a titanium silicide layer, a tantalum silicide layer, a zirconium silicide layer or a hafnium silicide layer, for example. The insulation layer 340 can be a silicon nitride layer, a silicon oxynitride layer or a silicon oxide layer, for example. Furthermore, the bonding strength of the metal within the metallic oxide layer 360 with oxygen is stronger than with chlorine atoms.

In summary, a polycide gate structure and a method of forming the polycide gate is described. In one embodiment of this invention, the patterned photoresist layer formed over the insulation layer is used as a mask in the second anisotropic etching operation to remove the exposed polysilicon layer. In another embodiment of this invention, the patterned photoresist layer formed over the insulation layer is not used as a mask in the second anisotropic etching operation, but is instead removed after the completion of the first anisotropic etching operation. Hence, the patterned insulation layer now becomes the hard mask layer in the second anisotropic etching operation.

This invention utilizes the formation of the metallic oxide layer 360 on the sidewalls of the silicide layer 330 after the first anisotropic etching step. Hence, the silicide layer 330 is protected from reactive components inside the HBr/$Cl_2$ plasma by the metallic oxide layer 360 when the polysilicon layer is etched in the second anisotropic etching step. In other words, undercutting of the silicide layer 330 is prevented. Furthermore, since no additives such as $CF_4$ and $C_2F_6$ molecules are added to the reactive plasma in the polysilicon etching operation, thickness variation with regard to the protective polymer layer across the wafer no longer presents a problem. Moreover, even if an insulation layer 340 fabricated from silicon nitride material is used as an etching hard mask, very little material will be removed from the insulation layer 340 due to attack by $CF_4$ plasma. Hence, loss of insulation material no longer presents a problem for forming self-aligned contacts in a subsequent operation.

It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims and their equivalents.

What is claimed is:

1. A method of forming a polycide gate, comprising the steps of:

providing a substrate having a gate dielectric layer, a polysilicon layer, a silicide layer and an insulation layer thereon, wherein the polysilicon layer is formed above the gate dielectric layer, the silicide layer is formed above the polysilicon layer, and the insulation layer is formed above the silicide layer;

forming a patterned photoresist layer over the insulation layer;

removing the exposed insulation layer by performing an anisotropic etching operation using the photoresist layer as an etching mask;

removing exposed silicide by performing a first anisotropic etching operation with a first type of plasma using the photoresist layer as a mask;

forming a metallic oxide layer over the sidewalls of the retained silicide layer by conducting an oxidation; and removing exposed polysilicon layer by performing a second anisotropic etching operation with a second type of plasma using the photoresist layer as a mask, wherein the second type of plasma has no effect on the metallic oxide layer.

2. The method of claim 1, wherein the step of forming a metallic oxide layer on the sidewalls of the silicide layer includes treating the substrate with oxygen plasma.

3. The method of claim 1, wherein the step of forming a metallic oxide layer on the sidewalls of the silicide layer includes treating the substrate with a $H_2SO_4/H_2O_2/H_2O$ mixture.

4. The method of claim 3, wherein sulfuric acid, hydrogen peroxide and water in the mixture of $H_2SO_4/H_2O_2/H_2O$ have a ratio of 1:1:5 respectively.

5. The method of claim 1, wherein the silicide layer formed from a group of materials that include tungsten silicide, titanium silicide, tantalum silicide, zirconium silicide and hafnium silicide.

6. The method of claim 1, wherein the first type of plasma includes $Cl_2/C_2F_6/N_2$ or $Cl_2/CF_4$ plasma.

7. The method of claim 1, wherein the second type of plasma includes $HBr/Cl_2$ plasma and the metallic element within the metallic oxide layer has a higher bonding strength with oxygen atoms than it does with chlorine atoms in the plasma.

8. The method of claim 1, wherein the insulation layer is formed from a group of materials that include silicon nitride, silicon oxynitride and silicon oxide.

9. A method of forming a polycide gate, comprising the steps of:

providing a substrate having a gate dielectric layer, a polysilicon layer, a silicide layer and an insulation layer thereon, wherein the polysilicon layer is formed above the gate dielectric layer, the suicide layer is formed above the polysilicon layer, and the insulation layer is formed above the silicide layer;

forming a patterned photoresist layer over the insulation layer to expose a portion of the insulation layer;

removing the exposed portion of the insulation layer by performing an anisotropic etching operation using the photoresist layer as an etching mask;

removing a portion of the silicide by performing a first anisotropic etching operation with a first type of plasma using the photoresist layer as a mask, so that a portion of the silicide layer remains above the polysilicon layer;

forming a metallic oxide layer over the sidewalls of the remaining portion of the silicide layer by oxidizing the sidewalls of the silicide layer; and removing exposed polysilicon layer by performing a second anisotropic etching operation with a second type of plasma, wherein the second type of plasma has no effect on the metallic oxide layer.

10. The method of claim 9, wherein a step of removing the photoresist layer is further performed after the step of removing exposed silicide.

11. The method of claim 9, wherein the insulation layer is used as a hard mask in the step of removing exposed polysilicon by performing a second anisotropic etching operation with a second type of plasma.

* * * * *